US012738552B2

(12) United States Patent
Lu

(10) Patent No.: US 12,738,552 B2
(45) Date of Patent: Sep. 15, 2026

(54) TEMPERATURE AND VOLTAGE ACQUISITION INTEGRATED MODULE AND BATTERY MODULE

(71) Applicant: EVE ENERGY CO., LTD., Huizhou (CN)

(72) Inventor: Jungao Lu, Huizhou (CN)

(73) Assignee: EVE ENERGY CO., LTD., Huizhou (CN)

( * ) Notice: Subject to any disclaimer, the term of this patent is extended or adjusted under 35 U.S.C. 154(b) by 576 days.

(21) Appl. No.: 18/227,318

(22) Filed: Jul. 28, 2023

(65) Prior Publication Data

US 2024/0332656 A1 Oct. 3, 2024

Related U.S. Application Data

(63) Continuation of application No. PCT/CN2023/089435, filed on Apr. 20, 2023.

(30) Foreign Application Priority Data

Apr. 3, 2023 (CN) ......................... 202310352151.2
Apr. 3, 2023 (CN) ......................... 202320721358.8

(51) Int. Cl.

| | |
|---|---|
| ***H01M 10/48*** | (2006.01) |
| ***G01K 7/22*** | (2006.01) |
| ***G01R 31/3835*** | (2019.01) |
| ***H01M 10/42*** | (2006.01) |

(52) U.S. Cl.

CPC ............ *H01M 10/486* (2013.01); *G01K 7/22* (2013.01); *G01R 31/3835* (2019.01); *H01M 10/4285* (2013.01); *G01K 2217/00* (2013.01)

(58) Field of Classification Search

CPC ............... H01M 10/48; H01M 10/486; H01M 10/4285; H01M 10/637; H01M 2010/4271; H01M 2010/4278; H01M 2200/105

See application file for complete search history.

(56) References Cited

U.S. PATENT DOCUMENTS

2014/0023897 A1 1/2014 Suga
2024/0030506 A1* 1/2024 Lee ..................... H01M 50/284

FOREIGN PATENT DOCUMENTS

CN 208723039 U 4/2019
CN 211125914 U 7/2020
CN 211318689 U 8/2020

(Continued)

OTHER PUBLICATIONS

CN 211318689 English translation. Zhao et al. China. Aug. 21, 2020. (Year: 2020).*

(Continued)

*Primary Examiner* — Christopher P Domone

(57) ABSTRACT

A temperature and voltage acquisition integrated module for acquiring the temperature and voltage of a battery module includes a substrate with thermal and electrical conductivity for connecting to a busbar in the battery module; a temperature acquisition component, attached to the substrate, insulated and separated from the substrate by an insulating layer, provided with a temperature acquisition pad; a temperature sensor, welded to the temperature acquisition component; and a voltage acquisition pad, provided on the substrate and electrically connected to the substrate.

17 Claims, 3 Drawing Sheets

(56) References Cited

FOREIGN PATENT DOCUMENTS

| | | | |
|---|---|---|---|
| CN | 212207611 | U | 12/2020 |
| CN | 115117489 | A | 9/2022 |
| CN | 115799771 | A | 3/2023 |
| EP | 3886206 | A1 | 9/2021 |

OTHER PUBLICATIONS

CN212207611 English translation. Jiang et al. China. Dec. 22, 2020. (Year: 2020).*

WIPO, International Search Report and Written Opinion for International Application No. PCT/CN2023/089435, Nov. 21, 2023.

The first office action issued in corresponding CN application No. 202310352151.2 dated Jul. 19, 2025.

Extended European search report issued in corresponding European application No. 23741579.9 dated Apr. 24, 2025.

The second office action issued in corresponding CN application No. 202310352151.2 dated Mar. 10, 2026.

* cited by examiner

TEMPERATURE AND VOLTAGE ACQUISITION INTEGRATED MODULE AND BATTERY MODULE

CROSS REFERENCE TO RELATED APPLICATIONS

The present application is a Continuation Application of PCT Application No. PCT/CN2023/089435 filed on Apr. 20, 2023, which claims priority of Chinese Patent Application No. 202310352151.2 filed on Apr. 3, 2023 before CNIPA, and Chinese Patent Application No. 202320721358.8 filed on Apr. 3, 2023 before CNIPA. All the above are hereby incorporated by reference in their entirety.

FIELD

The present application relates to the technical field of batteries, in particular to a temperature and voltage acquisition integrated module and a battery module.

BACKGROUND

With the development of power battery technology, the automation and modularization of encapsulating power battery system have gradually become the mainstream of the development. The battery module in the power battery system is of the most importance. At present, the battery module basically collects the voltage information and temperature information of the battery module through a connector, and the battery module transmits the collected status information of the battery module to the battery management system connected with the connector.

A temperature and voltage acquisition method, a temperature and voltage acquisition assembly and a battery module are disclosed in the related art, in which the temperature and voltage acquisition assembly includes a circuit board, a busbar, a first acquisition sheet, a nickel sheet and a temperature sensor; the first acquisition sheet and the nickel sheet are integrated with the busbar; pins of the nickel sheet are connected to the circuit board; the temperature sensor is connected to a protective segment of the first acquisition sheet through a heat conducting pad; the circuit board is connected to the temperature sensor through a first pad; and the circuit board is connected to a nickel layer of the first acquisition sheet through a second pad. However, there are the following problems: based on the installation relationship between the components of the temperature and voltage acquisition assembly, when assembling the components of the temperature and voltage acquisition assembly, first the temperature sensor is welded to the first pad, and then the first acquisition sheet is welded to the second pad to cover the temperature sensor by the protective segment. Therefore, the temperature sensor is not integrated with the first acquisition sheet, and the whole temperature and voltage acquisition assembly does not constitute a complete temperature and voltage acquisition module. For battery modules with different specifications, it is necessary to prepare temperature and voltage acquisition assembly with different specifications. For example, if the quantity or size of the battery cell is different, the size of the circuit board and the quantity of the busbar should also be adapted to change, which leads to the inability to realize the standardization of the acquisition assembly, thereby leading to the problems of such as the enhancement of the variety of materials and the amount of production line processes, high production cost and low production efficiency.

Disclosed in the related art is a voltage and temperature acquisition terminal and a battery module, in which the voltage and temperature acquisition terminal of the battery module includes a welding sheet for welding with a busbar; a crimp terminal and an NTC encapsulating housing provided side by side on an upper part of the welding sheet; the crimp terminal used to collect a voltage signal; and the NTC encapsulating housing filled with epoxy resin used to encapsulate an NTC thermistor located in the NTC encapsulating housing. The NTC thermistor is used to collect a temperature signal. However, there are the following problems: the heat conducting path of the voltage and temperature acquisition terminal is "from the welding sheet to the epoxy resin and then to the NTC thermistor". Using epoxy resin to locate the NTC thermistor in the NTC encapsulating housing will make it difficult to unify the positions of the NTC thermistors in their corresponding NTC encapsulating housings. Therefore, it is necessary to keep a large gap between the NTC thermistor and the inner wall of the NTC encapsulating housing to prevent the NTC thermistor from conducting with the inner wall of the NTC encapsulating body when encapsulating. But the large gap increases the length of the heat conduction path, which leads to the lower heat transmitting efficiency and an inability to effectively and quickly respond to abnormal temperature of the voltage and temperature acquisition terminal. Conversely, if the NTC thermistor conducts with the inner wall of the encapsulating body or welding sheet, a short circuit is formed, resulting in the inability to acquire temperature.

SUMMARY

In order to overcome at least one of the defects in the prior art mentioned above, provided in the present application is a temperature and voltage acquisition integrated module, which realize standardization and optimize the heat conducting path by temperature sensing, so as to improve the performance of the product.

As a first aspect, provided in the embodiment of the present application is a temperature and voltage acquisition integrated module, configured to acquire the temperature and voltage of a battery module, including:

a substrate with thermal and electrical conductivity, connected to a busbar in the battery module;

a temperature acquisition component, provided on the substrate, insulated and separated from the substrate by an insulating layer, provided with a temperature acquisition pad;

a temperature sensor, welded to the temperature acquisition component; and a voltage acquisition pad, provided on the substrate and electrically connected to the substrate.

In the temperature and voltage acquisition integrated module provided in the present application, the insulating layer between the temperature acquisition component and the substrate plays a role of insulative protection; the temperature sensor is welded on the temperature acquisition component; utilizing the thermal conductivity of the substrate, the temperature of the battery cell is transmitted to the temperature sensor through the substrate and the insulation layer in turn; while utilizing the conductivity of the substrate, the voltage of the battery cell is also acquired through the substrate, which realizes that the integrated module is used to acquire temperature and voltage simultaneously, so as to realize the standardization of the integrated module, effectively reduce the manufacturing process and material types, optimize the role of the temperature-sensitive heat conducting path, and the product performance is improved, thereby possessing a short heat conducting path, high heat conducting efficiency, and ability to effectively and quickly respond to abnormal temperatures in the prior art.

The standardization of the temperature and voltage acquisition module is embodied as follows: when it is applied to a battery module of any specification, a corresponding quantity of temperature and voltage acquisition module is adopted; the substrate is connected to the busbar in the battery module; and the temperature acquisition pads and voltage acquisition pads are welded to the acquisition wire to transmit the temperature information and voltage information to the battery management system.

In some implementations, the temperature acquisition component, the temperature sensor and the voltage acquisition pad are located on a first side wall of the substrate, so as to facilitate the manufacture of the temperature and voltage acquisition integrated module.

In some implementations, there are two temperature acquisition pads; the voltage acquisition pad and the two the temperature acquisition pads are spaced apart on a same side of the temperature sensor, so as to facilitate the welding between the acquisition wires and the pads.

In some implementations, the substrate is provided with at least one through-hole, in which the through-hole is located at least one of: between the two temperature acquisition pads and between the voltage acquisition pad and the temperature acquisition pads, so as to separate the pads by the through-hole.

In some implementations, the through-hole is an obround hole; two ends of the through-hole in a length direction respectively protrude from at least one of: two ends of the temperature acquisition pad and two ends of the voltage acquisition pad.

In some implementations, the temperature and voltage acquisition integrated module further includes a protective cover provided on the substrate, sheathing the temperature sensor; the temperature acquisition pad and the voltage acquisition pad are located outside of the protective cover.

In some implementations, the protective cover is filled with protective plastic wrapped around the temperature sensor, and a side wall of the protective cover away from the substrate is provided with an opening for glue injection. In such a setup, the protective plastic is injected through the opening of the protective cover to wrap the temperature sensor. The protective cover avoids external impact and fixes the shape of the protective plastic. The protective plastic avoids water vapor and foreign matters with electrical conductivity, so as to ensure the normal operation of the temperature sensor.

In some implementations, the temperature sensor is an NTC thermistor.

As a second aspect, provided in the embodiment of the present application is a battery module, including a battery cell, a busbar and the temperature and voltage acquisition integrated module mentioned above; the battery cell is connected to the busbar; and a substrate of the temperature and voltage acquisition integrated module is welded to the busbar.

In some implementations, a welding groove is provided on the busbar, and a second side of the substrate abuts and is welded to the welding groove. In such a setup, the temperature and voltage acquisition integrated module are located on the welding groove, so as to store the temperature and voltage acquisition integrated module, which prevents the temperature and voltage acquisition integrated module from exposing, or which reduces the exposed height of the temperature and voltage acquisition integrated module, thereby reducing the risk of shock to the temperature sensor.

In some embodiments, the temperature and voltage acquisition integrated module provided in the present application provides technical effects as follows:

standardization is achieved: the substrate is connected to the busbar of the battery module by welding, threaded connection or other manners. The temperature and voltage transmission are achieved by utilizing the thermal and conductive properties of the substrate, and the temperature acquisition component and temperature sensor are protected by an insulating layer to avoid a short circuit. When the integrated module is applied to a battery module of any specification, the integrated module is used to collect temperature and voltage simultaneously, which enables the standardization of the integrated module and the effective reduction of the manufacturing process and material types.

short temperature-sensitive heat conducting path and good performance of the product: the heat conducting path is "from the substrate—to the insulating layer—and then to the temperature sensor"; the electrical conducting path is "from the substrate—to the voltage acquisition pad"; the insulating layer is relatively thin, and the influence on the heat conducting distance and efficiency is basically ignored; and adopting the temperature acquisition component to increase the temperature acquisition area of the substrate, which effectively shortens the heat conducting path and improves the heat transmitting efficiency, thereby effectively and quickly responding to the presence of abnormal temperature and greatly improving the product performance of the integrated module.

high safety: a protective cover incorporating protective plastic is provided to prevent possible temperature sensor failure under various conditions; in the battery module, welding grooves on the busbar are utilized to install the temperature and voltage acquisition integrated module, thereby reducing the risk of impact to the temperature sensor.

REFERENCE LIST

1 temperature and voltage acquisition integrated module; 11 substrate; 111 through-hole; 112 connecting hole; 12 temperature acquisition component; 121 temperature acquisition pad; 122 temperature-sensitive welded joint; 13 insulating layer; 14 temperature sensor; 15 voltage acquisition pad; 16 protective cover; 161 opening; 162 connecting joint; 2 busbar; 21 welding groove.

DETAILED DESCRIPTION

In the description of the present application, the orientation or position relationships between the components of the present application are indicated by the terms of orientation or position such as "upper", "down", "front", "back", "left", "right", "vertical", "horizontal", "top", "bottom", "inside", "outside". It is to be noted that the orientation or position relationships are based on the orientation or position relationships shown in the attached drawings. The use of the terms of orientation or position to indicate the orientation and position relationships between components is only intended to simplify the relationships between the components and facilitate the description of the relationships, but not to indicate or imply that the referred the components of the present application has a specific orientation, or is constructed and operated in a specific orientation. Therefore, the terms of orientation or position should not be construed as a limitation of the relationships between the components of the present application.

In the embodiments of the present application, the terms "first" and "second" are used for descriptive purposes only, and are not to be construed as indicating or implying relative importance or implicitly specifying the number of technical features indicated. Thus, a feature qualified with "first" and "second" may expressly or implicitly include one or more such features.

References in this specification to such as "an embodiment" or "some embodiments" imply that one or more embodiments of the present application include a particular feature, structure or characteristic described in connection with that embodiment. "in some other embodiments" and the like do not necessarily refer to the same embodiment, but rather imply "one or more, but not all, embodiments" unless otherwise specifically emphasized. The terms "including", "comprising", "having", and variations thereof all mean "including but not limited to," unless otherwise specifically emphasized.

Figure 1:
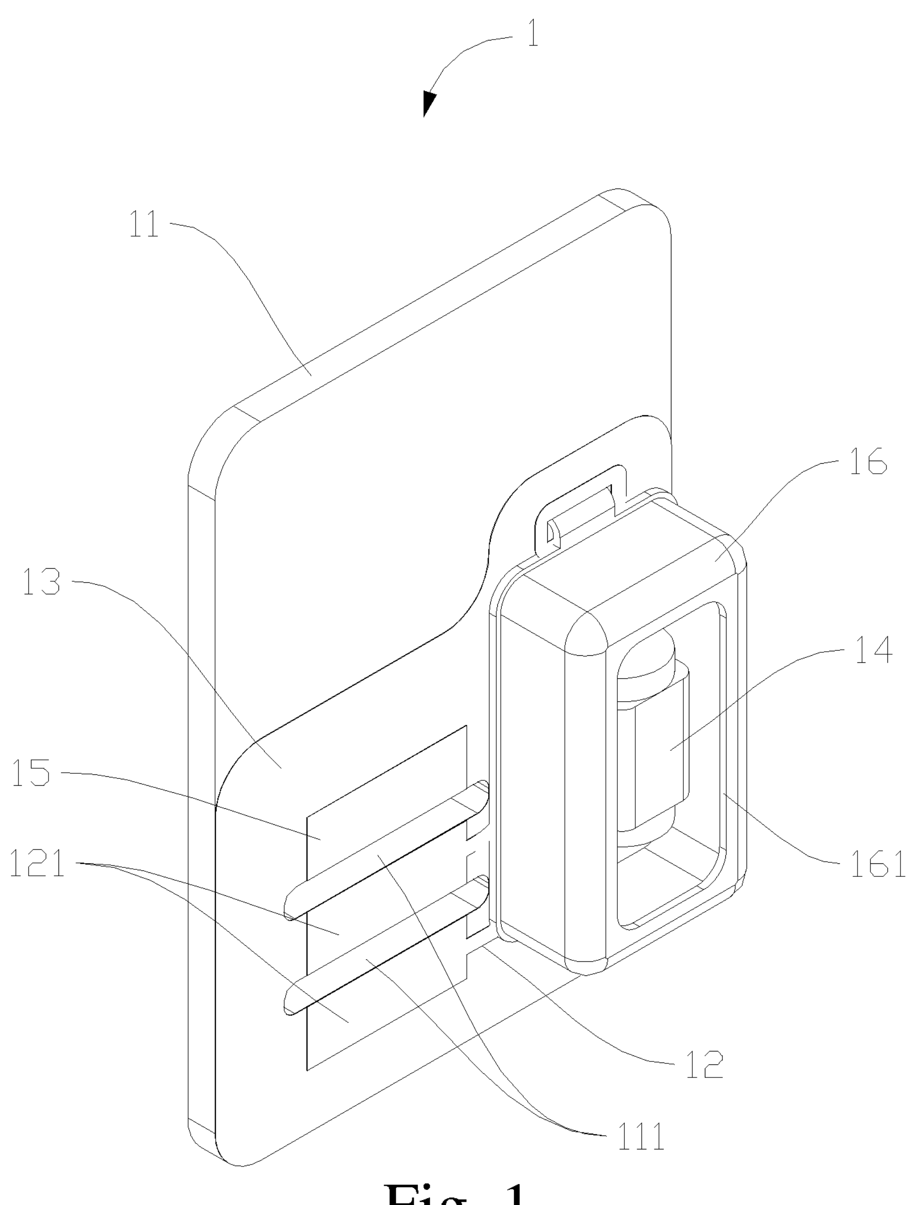
FIG. 1 is a perspective structural diagram of the temperature and voltage acquisition integrated module in some embodiments.
Figure 2:
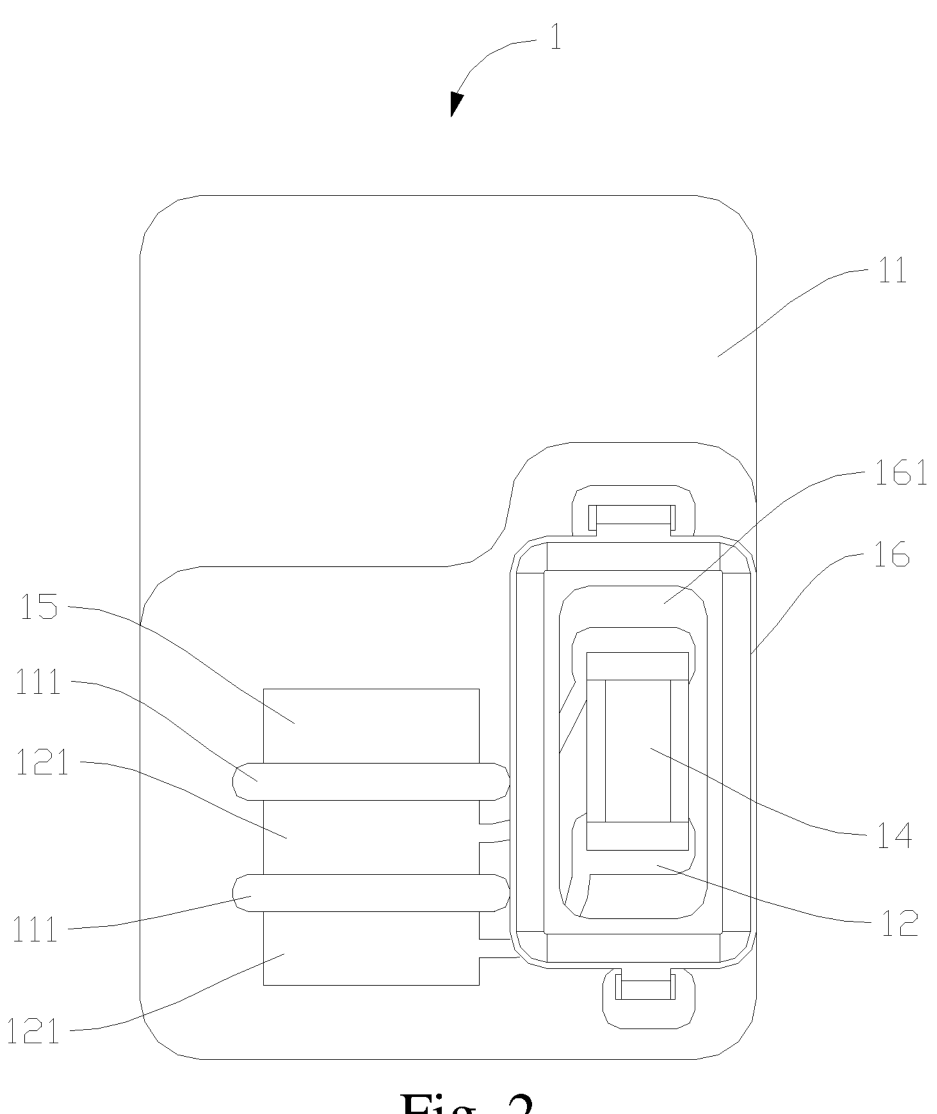
FIG. 2 is a front view of the temperature and voltage acquisition integrated module in some embodiments.

Referring to FIG. 1 and FIG. 2, the present application discloses a temperature and voltage acquisition integrated module 1, provided for acquiring the temperature and voltage of the battery module, including a substrate 11, a temperature acquisition component 12, an insulating layer 13, a temperature sensor 14, a voltage acquisition pad 15 and a protective cover 16.

In some embodiments, the substrate 11 serves as a main carrier to carry the other components, and the substrate 11 also has thermal and electrical conductivity, connected to a busbar 2 in the battery module, so as to transmit the temperature and voltage of the battery cell. In some embodiments, the substrate 11 is a metal board, such as an aluminum board or a copper board. in some other embodiments, the substrate 11 is made of graphene composites. as long as the substrate 11 possess the thermal and electrical conductivity and certain load-carrying capacity.

In some embodiments, the substrate 11 is a rectangular or square aluminum board. A thickness of the substrate 11 is between 0.2 mm and 3 mm. A length of one side of the substrate 11 is between 8 mm and 25 mm; and a length of another side of the substrate 11 is between 6 mm and 20 mm. In some other embodiments, a thickness of the substrate 11 is between 0.5 mm and 1 mm. A length of one side of the substrate 11 is between 10 mm and 16 mm; and a length of another side of the substrate 11 is between 8 mm and 12 mm.

In some embodiments, the substrate 11 is also diamond-shaped, pentagonal or hexagonal, etc. The specific shape of the substrate 11 is not limited in the present application.

In some embodiments, the temperature acquisition component 12 is provided on the substrate 11. The temperature sensor 14 is welded to the temperature acquisition component 12 to fix on the substrate 11. The temperature acquisition component 12 is insulated and separated from the substrate 11 by an insulating layer 13, which prevents the temperature acquisition component 12 from conducting to the substrate 11, so as to prevent the temperature sensor 14 from conducting to the substrate 11 and avoid short circuit in the temperature and voltage acquisition integrated module 1 thereby. The insulating layer 13 acts as insulation protection for a circuit in the temperature and voltage acquisition integrated module 1. The temperature acquisition component 12 includes a temperature acquisition pad 121 used to weld with the acquisition wires that are not part of the temperature and voltage acquisition integrated module 1. The temperature and voltage acquisition integrated module 1 transmits the temperature information to a battery management system through the acquisition wires.

Figures 3, 4:
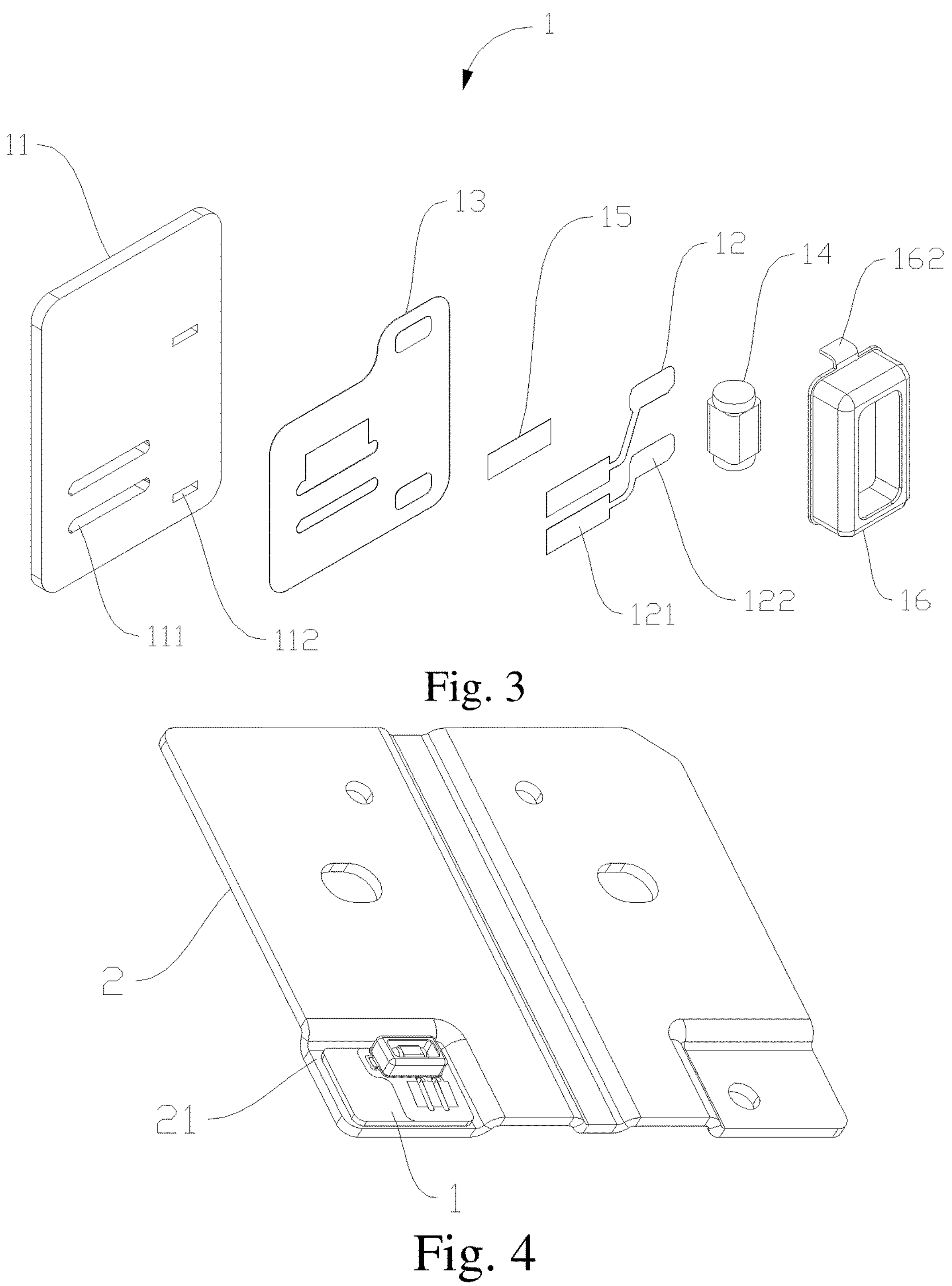
FIG. 3 is an exploded view of the temperature and voltage acquisition integrated module in some embodiments.
FIG. 4 is a perspective structural diagram of the temperature and voltage acquisition integrated module connected to the busbar in some embodiments.

Referring to FIGS. 1 to 3, in some embodiments, the temperature acquisition component 12 includes a first sub-component and a second sub-component connected to two ends of the temperature sensor 14 respectively. The first sub-component and the second sub-component are spaced apart. The first sub-component includes a temperature acquisition pad 121 and a temperature-sensitive welded joint 122 which are interconnected. The second sub-component includes a temperature acquisition pad and a temperature-sensitive welded joint which are interconnected. The two ends of the temperature sensor 14 are welded to the two temperature-sensitive welded joints 122 respectively.

In some embodiments, the insulation layer 13 is prepared by coating the surface of substrate 11, or the insulating layer 13 is also adhered to the surface of the substrate 11. The temperature acquisition component 12 is made of copper foil, aluminum foil, nickel foil, tin foil or lead foil, etc. For example, the temperature acquisition component 12 is made of copper foil. In some other embodiments, the temperature acquisition component 12 is also made of other kinds of metal foil or metal sheets. In some embodiments, the temperature acquisition component 12 is adhered to a surface of the insulating layer 13 away from the substrate 11, or the temperature acquisition component 12 is also partially fused in the insulating layer 13.

In some embodiments, a thickness of the insulating layer 13 is between 0.01 mm and 1 mm. In some embodiments, the insulating layer 13 fully or partially covers any one of the surfaces of the substrate 11, as long as to insulate and separate the temperature acquisition component 12 from the substrate 11. In some embodiments, a thickness of the temperature acquisition component 12 is between 0.01 mm and 1 mm.

In some embodiments, the temperature sensor 14 is an NTC (negative temperature coefficient, which refers to the phenomenon and material that the resistance decreases with the increase of temperature) thermistor, which detects tiny temperature differences sensitively. When the temperature transmitted to the NTC thermistor changes, the resistance of the NTC thermistor also changes, thereby the temperature change is collected according to the resistance change of the NTC thermistor. In some embodiments, the temperature sensor 14 is a PTC (positive temperature coefficient) thermistor or other kinds of thermistor.

In some embodiments, a voltage acquisition pad 15 is provided on the substrate 11 and electrically connected to the substrate 11. The voltage acquisition pad 15 is welded to the acquisition wires, so as to transmit the voltage information to the battery management system through the acquisition wires. In some embodiments, the voltage acquisition pad 15 is attached and electrically conducted to the substrate 11. And a special process is adopted to realize the electrical conduction between the voltage acquisition pad 15 and the substrate 11. For example, the voltage acquisition pad 15 is made of metal (such as copper, nickel, aluminum, or lead) foil or metal sheet. which abuts and is welded to the substrate 11. In some other embodiments, the voltage acquisition pad 15 is formed by coating molten metal (such as copper, nickel, tin, aluminum or lead) liquid on the substrate 11. In some other embodiments, an exposed welding position of the substrate 11 is a substitute for the voltage acquisition pad 15. The connection manner between the voltage acquisition pad 15 and the substrate 11, and forming manner of the voltage acquisition pad 15 are not limited in the present application.

In some embodiments, in order to prevent the insulating layer 13 from influencing the electrical conductivity of the voltage acquisition pad 15, an avoiding hole is provided on the insulating layer 13 at the location of the voltage acquisition pad 15. The shape and the size of the avoiding hole are adjusted to the voltage acquisition pad 15.

In some embodiments of the present application, the temperature and voltage acquisition integrated module 1 collects temperature information and voltage information through the temperature sensor 14 and the substrate 11 respectively, and the temperature and voltage acquisition integrated module 1 outputs temperature information and voltage information through the temperature acquisition pad 121 and the voltage acquisition pad 15 respectively, so that it is achieved that the temperature and voltage is collected collectively. In the present application, the collecting function of the temperature and voltage is integrated into the temperature and voltage acquisition integrated module 1, which not only realizes the modulization and standardization of the apparatus for collecting temperature and voltage, but also reduces the manufacturing process and the material types of the apparatus for collecting temperature and voltage. In addition, in the temperature and voltage acquisition integrated module 1, the thermal conductivity path is "from the substrate 11—to the insulating layer 13—and then to the temperature sensor 14"; the electrical conductivity path is "from the substrate 11—to the voltage acquisition pad 15". Regarding the thermal conductivity path, the insulating layer 13 of the temperature and voltage acquisition integrated module 1 is relatively thin, and the influence on the heat conducting distance and efficiency is basically ignored. Additionally, adopting the temperature acquisition component 12 to increase the temperature acquisition area of the substrate 11, which effectively shortens the heat conducting path and improves the heat transmitting efficiency. In the present application, the temperature information is analyzed to determine whether abnormal temperatures occur, and an increase of thermal conductivity efficiency enables effective and rapid output of temperature information, thereby improving the speed of detection and response to abnormal temperatures by the temperature and voltage acquisition integrated module 1, which in turn improves its product performance.

Referring to FIG. 1, in the present application, a protective cover 16 is provided on the substrate 11, covering the temperature sensor 14; the temperature acquisition pad 121 and the voltage acquisition pad 15 are located outside of the protective cover 16. In some embodiments, the protective cover 16 is filled with protective plastic (not shown in the figures) wrapped around the temperature sensor 14, and a side of the protective cover 16 away from the substrate 11 is provided with an opening 161, and the protective plastic is available by injecting glue into the protective cover 16 from the opening 161. The protective cover 16 plays roles as follows: preventing the external impulsive force from directly acting on the temperature sensor 14 to cause failure, so as to prevent temperature sensor 14 from failing due to external impact forces; and used to secure the shape of the protective plastic, so as to provide a container for the protective plastic or accommodate the protective plastic. The protective plastic plays roles as follows: preventing foreign objects with electrical conductivity from falling into the protective cover 16 and conduct the temperature-sensitive welded joint 122, which leads to failure of the temperature sensor 14; preventing water vapor from invading inside the temperature sensor 14, and result in failure; force cushioning, which partly absorbs the impact imposed on the protective cover 16, so as to reduce the impact subjected to the temperature sensor 14 to achieve the function of buffering, thereby preventing the protective cover 16 from deformation leading to failure of the temperature sensor 14.

Referring to FIG. 1 and FIG. 3, in order to facilitate the installation of the protective cover 16 on the substrate 11. In some embodiments, the protective cover 16 is provided with connecting joints 162 respectively at two lengthwise ends of the protective cover 16; and the substrate 11 is provided with connecting holes 112 corresponding to the connecting joints 162. In the present application, the connecting joints 162 are inserted into the connecting holes 112, in which the connecting holes 112 are fastened by bending the connecting joints 162, and are bent by breaking the connecting joints 162 to snap the connecting joints into the connecting holes 112, so as to complete the installation of the protective cover 16 on the substrate 11, so that the protective cover 16 is mounted on the substrate 11. In some other embodiments, the protective cover 16 is mounted on the substrate 11 in other manners. The installation of the protective cover 16 is not specifically limited in the present application.

In some embodiments, the protective cover 16 is made of metal, so as to ensure the protective cover 16 possesses enough connecting strength and impact strength. In some other embodiments, the protective cover 16 is also made of plastic or other kinds of materials.

In some embodiments, the substrate 11 has a first side and a second side respectively on opposite sides. The temperature acquisition component 12, the insulating layer 13, the temperature sensor 14, the voltage acquisition pad 15, and the protective cover 16 are located on the first side of the substrate 11, so as to reduce the difficulty of manufacturing the temperature and voltage acquisition integrated module 1.

Referring to FIG. 2, in some embodiments, the voltage acquisition pad 15 and the two temperature acquisition pads 121 are spaced apart on a same side of the temperature sensor 14. Referring to the orientation and the relative position of the structure shown in FIG. 2, in some embodiments, the voltage acquisition pad 15 and the two temperature acquisition pads 121 are all located on the left side of the temperature sensor 14 and the protective cover 16. the two temperature acquisition pads are two temperature acquisition pads 121 and the voltage acquisition pad 15, the two temperature acquisition pads 121 are sequentially arranged in a first direction from a top towards a bottom of the temperature sensor 14.

In some embodiments, a minimum distance in the first direction between the voltage acquisition pad 15 and the temperature acquisition pad 121, and a minimum distance in the first direction between the two temperature acquisition pads 121 are both larger than 0.3 mm. In some other embodiments, the minimum distances in the first direction are larger than 0.5 mm.

In some embodiments, the voltage acquisition pad 15 and the temperature acquisition pads 121 and 125 are all rectangular in shape, whose length (in some embodiments of the present application, a length of a structure is a dimension in a second direction, in which the second direction is perpendicular to the first direction and parallel to the surface of the substrate.) are all between 2 mm and 5 mm, whose width (in some embodiments of the present application, a width of a structure is a dimension in a first direction.) are all between 0.8 mm and 2 mm. In some other embodiments, the length thereof is all between 3 mm and 4 mm, and the width thereof are between 1 mm and 1.5 mm.

Referring to FIG. 2 and FIG. 3, in some embodiments, the substrate 11 is provided with two through-holes 111; one through-hole 111 is located between two temperature acquisition pads 121; the other through-hole 111 is located between the voltage acquisition pad 15 and the temperature acquisition pad 121, so as to separate the pads by the through-holes 111, i.e., the adjacent pads are not connected with each other, which prevents multiple welding scars generated between each pads and the acquisition wires when each pads are welded to the acquisition wires from conduction due to the connection of pads. In addition, spacing the pads through the through holes 111 allows space to exist between adjacent pads so that the space between adjacent pads is used to clean up the exposed portion of the welding scars relative to the pads.

In some embodiments, the quantity of the through-holes 111 varies. For example, there is only one through-hole 111, which is located between the two temperature acquisition pads 121, or between the voltage acquisition pad 15 and the first temperature acquisition pad 121.

In some embodiments, the through-hole 111 is an obround hole. Two ends of the through-hole 111 in a length direction protrude from two sides of the temperature acquisition pad 121 or two sides of the voltage acquisition pad 15, so as to better separate the pads and reduce the possibility of contacting between the two adjacent pads.

Referring to FIG. 4, in some embodiments, a battery module includes a temperature and voltage acquisition integrated module 1, a busbar 2 and a battery cell (not shown in the figures). The battery cell is connected to the busbar 2; and a substrate 11 of the temperature and voltage acquisition integrated module 1 is welded to the busbar 2.

In the present application, when applying the temperature and voltage acquisition integrated module 1 to battery module of any specifications, the amount of temperature and voltage acquisition integrated module 1 corresponding to the specifications of the battery module is set according to the specifications of the battery module so that its substrate 11 is welded to the busbar 2 in the battery module, and the temperature acquisition pads 121 and voltage acquisition pads 15 are welded to the acquisition wires to deliver the temperature information and voltage information to the battery management system.

In some embodiments, the acquisition wire is a wire harness or a flexible printed circuit connector. The acquisition wire is used to transfer information.

In some embodiments, the busbar 2 is used to connect two adjacent battery cells in series with each other. A welding groove 21 is provided on the busbar 2, and the second side of the substrate 11 abuts and is welded to the welding groove 21. In the present application, the temperature and voltage acquisition integrated module 1 is provided on the welding groove 21 relative to the busbar 2, so as to store the temperature and voltage acquisition integrated module 1, which prevents the temperature and voltage acquisition integrated module 1 from exposing, or which reduces the exposed height of the temperature and voltage acquisition integrated module 1, thereby reducing the risk of shock to the temperature sensor 14.

In other embodiments, the temperature and voltage acquisition integrated module 1 is provided in parallel to the busbar 2. Through one edge of the substrate 11 is welded to one edge of the busbar 2 to connect the temperature and voltage acquisition integrated module 1 with the busbar 2.

In some embodiments, referring to FIG. 3, the manufacturing process of the temperature and voltage acquisition integrated module 1 provided in the present application is as follows:

cutting out the substrate 11 in the shape and preparing holes on the substrate 11 according to the design requirements;

welding the voltage acquisition pad to the substrate 11;

applying insulating paint to the first side of the substrate 11 to prepare the insulating layer 13; adhering the temperature acquisition component 12 to the insulating layer 13 in a state where the insulating layer 13 is half dry or fully dry, so that the temperature acquisition component 12 is fixedly connected to the insulating layer 13;

welding the temperature sensor 14 to the temperature-sensitive welded joint 122 of the temperature acquisition components 12;

inserting the connecting joints 162 of the protective cover 16 into the connecting holes 112; mounting the protective cover 16 on the substrate 11 by coupling the connecting joints 162 with the connecting holes 112;

and injecting protective plastic through the opening 161 of the protective cover 16.

In some embodiments, referring to FIG. 1 and FIG. 4, the working process of the temperature and voltage acquisition integrated module 1 and the battery module provided in the present application is as follows:

The heat of multiple battery cells is all transferred to the busbar 2 and then transferred to the substrate 11 through the bonding surface of the busbar 2 and the substrate 11, so it is achieved that the temperature and voltage acquisition integrated module 1 collects the temperature of the battery cells. Exemplarily, the heat of the substrate 11 is radiated to the temperature acquisition component 12 and the temperature sensor 14 through the insulating layer 13. The resistance of the temperature sensor 14 changes after receiving the heat. By analyzing the resistance of the temperature sensor 14 to acquire the temperature signal, so that the collection of the temperature of the battery cell is finished.

In some embodiments, the temperature and voltage acquisition integrated module 1 is able to collect the temperature of the battery cell, and is able to transmit the temperature signal from the temperature acquisition pad 121 to the battery management system by the acquisition wires. In addition, the voltage of the battery cell is conducted to the busbar 2 and the substrate 11, so as to acquire the voltage of the battery cell, and the voltage signal is able to be transmitted from the voltage acquisition pad 15 to the battery management system by the acquisition wires.

In some embodiments, the temperature and voltage acquisition integrated module 1 provided in the present application provides technical effects as follows:

standardization is achieved: In the temperature and voltage acquisition integrated module 1, the temperature information and voltage information is collected by the temperature sensor 14 and the substrate 11 respectively, and the temperature information and voltage information is output by the temperature acquisition pad 121 of the temperature acquisition component 12 and the voltage acquisition pad 15 respectively, so that it is achieved that the temperature and voltage is collected collectively. In the present application, the collecting function of the temperature and voltage is integrated into the temperature and voltage acquisition integrated module 1, which not only realizes the modulization and standardization of the apparatus for collecting temperature and voltage, but also reduces the manufacturing process and the material types of the apparatus for collecting temperature and voltage.

short heat conducting path and good performance of the temperature and voltage acquisition integrated module 1: regarding the temperature and voltage acquisition integrated module 1, the heat conducting path is "from the substrate 11—to the insulating layer 13—and then to the temperature sensor 14"; the electrical conductivity path is "from the substrate 11—to the voltage acquisition pad 15". Regarding the heat conducting path, the insulating layer 13 is relatively thin, the influence on the heat conducting distance and efficiency is basically ignored. In addition, adopting the temperature acquisition component 12 to increase the temperature acquisition area of the substrate 11, which effectively shortens the heat conducting path and improves the heat conducting efficiency. In the present application, the temperature information is analyzed to determine whether abnormal temperatures occur, and an increase of thermal conductivity efficiency enables effective and rapid output of temperature information, thereby improving the speed of detection and response to abnormal temperatures by the temperature and voltage acquisition integrated module 1, which in turn improves its product performance.

high safety: a protective cover 16 incorporating protective plastic is provided to prevent possible temperature sensor 14 failure under various conditions; In the battery module, the temperature and voltage acquisition integrated module 1 is provided on the welding grooves 21 relative to the busbar 2, which reduces the risk of impact to the temperature sensor 14.

The above description is only a specific implementation of the present application, but the scope of protection of the present application is not limited to this, and any person skilled in the art may easily think of variations or substitutions within the technical scope disclosed in the present application, which should be covered by the scope of protection of the present application. The embodiments of the present application and the features in the embodiments may be combined with each other without conflict. Therefore, the scope of protection of this application shall be subject to the scope of protection of the claims.

The invention claimed is:

1. A temperature and voltage acquisition integrated module, configured to acquire a temperature and a voltage of a battery module, comprising:

- a substrate with thermal and electrical conductivity, connected to a busbar in the battery module;
- a temperature acquisition component, provided on the substrate, insulated and separated from the substrate by an insulating layer, provided with a temperature acquisition pad;
- a temperature sensor, welded to the temperature acquisition component; and
- a voltage acquisition pad, provided on the substrate and electrically connected to the substrate;
- wherein the temperature acquisition component, the temperature sensor and the voltage acquisition pad are located on a first side wall of the substrate.

2. The temperature and voltage acquisition integrated module according to claim 1, wherein there are two temperature acquisition pads; the voltage acquisition pad and the two temperature acquisition pads are spaced apart on a same side of the temperature sensor.

3. The temperature and voltage acquisition integrated module according to claim 2, wherein the substrate is provided with at least one through-hole, the through-hole is located at least one of: between the two temperature acquisition pads and between the voltage acquisition pad and the temperature acquisition pads.

4. The temperature and voltage acquisition integrated module according to claim 3, wherein the through-hole is an obround hole; two ends of the through-hole in a length direction respectively protrude from at least one of: two ends of the temperature acquisition pad and two ends of the voltage acquisition pad.

5. The temperature and voltage acquisition integrated module according to claim 1, further comprising a protective cover, provided on the substrate, sheathing the temperature sensor; the temperature acquisition pad and the voltage acquisition pad are located outside the protective cover.

6. The temperature and voltage acquisition integrated module according to claim 5, wherein the protective cover is filled with protective plastic wrapped around the temperature sensor, and a side wall of the protective cover away from the substrate is provided with an opening for glue injection.

7. The temperature and voltage acquisition integrated module according to claim 1, wherein the temperature sensor is an NTC thermistor.

8. A battery module, comprising a battery cell, a busbar and the temperature and voltage acquisition integrated module as claimed in claim 1; the battery cell is connected to the busbar; and a substrate of the temperature and voltage acquisition integrated module is welded to the busbar.

9. A battery module, comprising a battery cell, a busbar and the temperature and voltage acquisition integrated module as claimed in claim 2; the battery cell is connected to the busbar; and a substrate of the temperature and voltage acquisition integrated module is welded to the busbar.

10. A battery module, comprising a battery cell, a busbar and the temperature and voltage acquisition integrated module as claimed in claim 3; the battery cell is connected to the busbar; and a substrate of the temperature and voltage acquisition integrated module is welded to the busbar.

11. A battery module, comprising a battery cell, a busbar and the temperature and voltage acquisition integrated module as claimed in claim 4; the battery cell is connected to the busbar; and a substrate of the temperature and voltage acquisition integrated module is welded to the busbar.

12. A battery module, comprising a battery cell, a busbar and the temperature and voltage acquisition integrated module as claimed in claim 5; the battery cell is connected to the busbar; and a substrate of the temperature and voltage acquisition integrated module is welded to the busbar.

13. A battery module, comprising a battery cell, a busbar and the temperature and voltage acquisition integrated module as claimed in claim 6; the battery cell is connected to the busbar; and a substrate of the temperature and voltage acquisition integrated module is welded to the busbar.

14. A battery module, comprising a battery cell, a busbar and the temperature and voltage acquisition integrated module as claimed in claim 7; the battery cell is connected to the busbar; and a substrate of the temperature and voltage acquisition integrated module is welded to the busbar.

15. The battery module according to claim 8, wherein the busbar is provided with a concave welding groove, a second side wall of the substrate abuts and is welded to a wall of the welding groove.

16. The battery module according to claim 9, wherein the busbar is provided with a concave welding groove, a second side wall of the substrate abuts and is welded to a wall of the welding groove.

17. The battery module according to claim 10, wherein the busbar is provided with a concave welding groove, a second side wall of the substrate abuts and is welded to a wall of the welding groove.

* * * * *